United States Patent [19]
Pei et al.

[11] Patent Number: 5,997,317
[45] Date of Patent: Dec. 7, 1999

[54] BALL GRID ARRAY CONNECTOR

[75] Inventors: Wen-Chun Pei; Ming-Lun Szu, both of Taipei, Taiwan

[73] Assignee: Hon Hai Precision Ind. Co., Ltd., Taipei Hsien, Taiwan

[21] Appl. No.: 09/337,166

[22] Filed: Jun. 21, 1999

[30] Foreign Application Priority Data

Sep. 29, 1998 [TW] Taiwan .................................. 87216147

[51] Int. Cl.[6] ...................................................... H01R 4/02
[52] U.S. Cl. .................................................. 439/83; 439/71
[58] Field of Search ................... 439/83, 70, 71, 439/876

[56] References Cited

U.S. PATENT DOCUMENTS

| | | | |
|---|---|---|---|
| 5,475,317 | 12/1995 | Smith ........................................ | 439/71 |
| 5,591,941 | 1/1997 | Acocella et al. ........................... | 439/83 |
| 5,593,322 | 1/1997 | Swamy et al. ............................. | 439/83 |
| 5,691,041 | 11/1997 | Frankeny et al. ......................... | 439/71 |
| 5,895,281 | 4/1999 | Rothenberger ............................ | 439/83 |

*Primary Examiner*—Gary F. Paumen
*Attorney, Agent, or Firm*—Wei Te Chung

[57] ABSTRACT

A ball grid array connector comprises an insulative housing having a mating face and a soldering face opposite to the mating face and a plurality of passageways defined between the mating face and the soldering face. A plurality of contacts are received in the passageways and each contact comprises a contacting portion and a soldering portion substantially perpendicular to the soldering portion. A solder ball is attached to the soldering portion of each contact and the solder ball has a diameter less than a width of the soldering portion of the contact.

12 Claims, 6 Drawing Sheets

BALL GRID ARRAY CONNECTOR

BACKGROUND OF THE INVENTION

1. Field of The Invention

The present invention relates to a ball grid array connector, especially a ball grid array connector having a positioning structure for retaining corresponding solder balls in position.

2. The Prior Art

Through hole type connectors have been used for decades. However, these kinds of connectors need the soldering pins thereof to pass through soldering holes in a printed circuit board thereby occupying two sides of the printed circuit board. Ball grid array (BGA) connectors are used to replace the through hole connectors because they only need the soldering tails of the connectors to be directly soldered on the printed circuit board via a solder ball. Therefore other side of the printed circuit board can be used for other components. For a BGA connector, a solder ball has to be soldered on the tail of the connector in advance and then soldered on the printed circuit board via a baking procedure. A conventional BGA connector 5 as shown in FIG. 6 comprises a housing 52 having a soldering face 521 and a plurality of contacts 51 received therein (only one is shown). A soldering tail 511 of the contact 51 extends beyond the soldering face 521 and comprises a bottom 512 to which a solder ball 23 is in advance soldered. The solder ball 23 is then soldered on a conductor pad 31 of a printed circuit board 30. It is difficult to properly position the solder ball 23 to the solder tail 511 because the bottom 512 of the solder tail 511 is only a relatively small plane. Therefore, some of the solder balls 23 (not shown) are apt to be attached to one edge of the soldering tail 511 which in turn damages the coplanarity of the solder balls 23.

It is requisite to provide an additional positioning structure to solve the above problem.

SUMMARY OF THE INVENTION

The primary purpose of the present invention is to provide a BGA connector having a good positioning structure for fixing the solder balls in proper position.

In accordance with one aspect of the present invention, a ball grid array connector comprises an insulative housing having a mating face and a soldering face opposite to the mating face and a plurality of passageways defined between the mating face and the soldering face. A plurality of contacts are received in the passageways and each contact comprises a contacting portion and a soldering portion substantially perpendicular to the soldering portion. A solder ball is attached to the soldering portion of each contact and the solder ball has a diameter less than a width of the soldering portion of the contact.

DETAILED DESCRIPTION OF THE PREFERRED EMBODIMENT

Figure 1A:
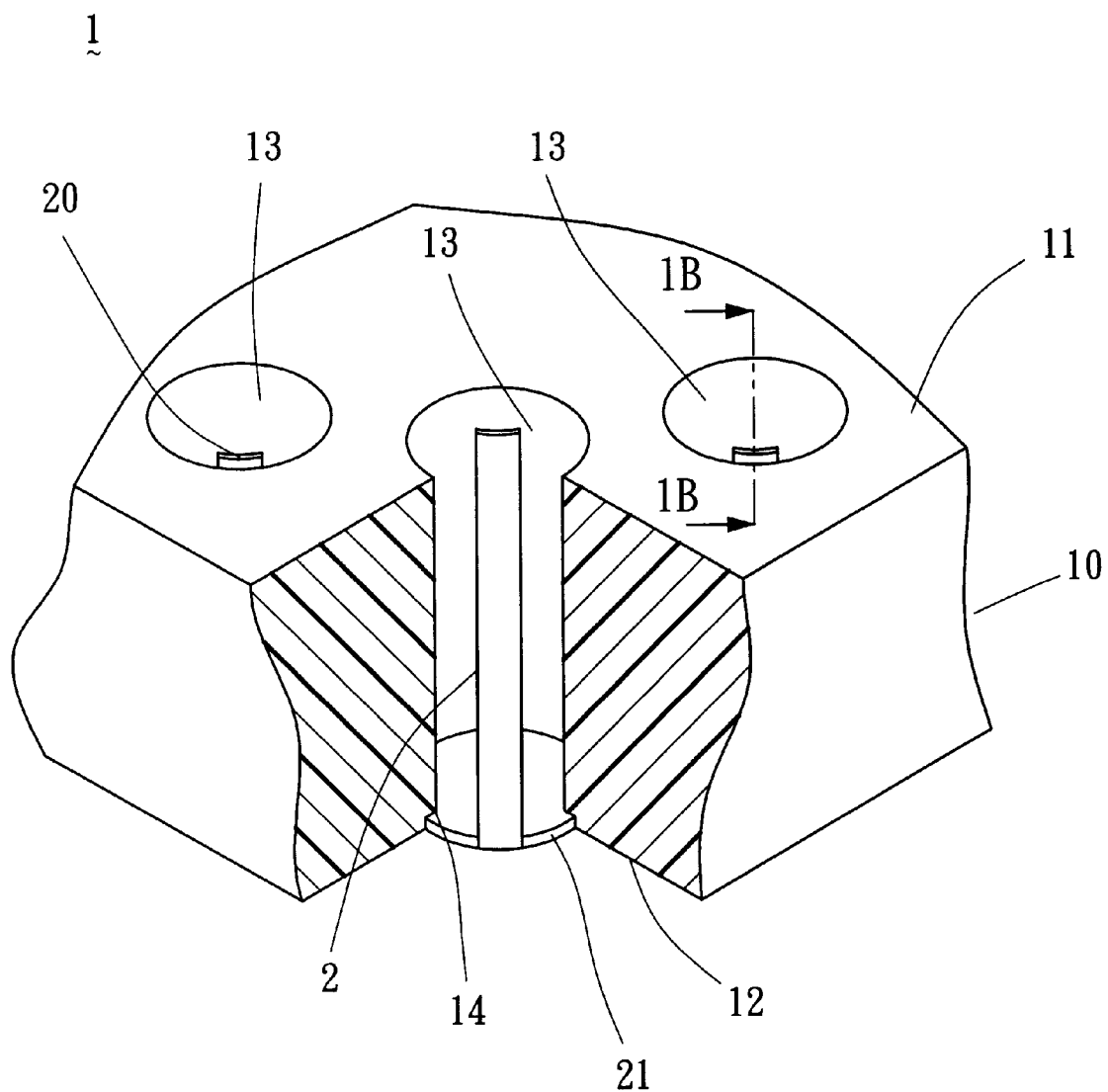
FIG. 1A is a perspective view of a BGA connector in accordance with the present invention.
Figure 1B:
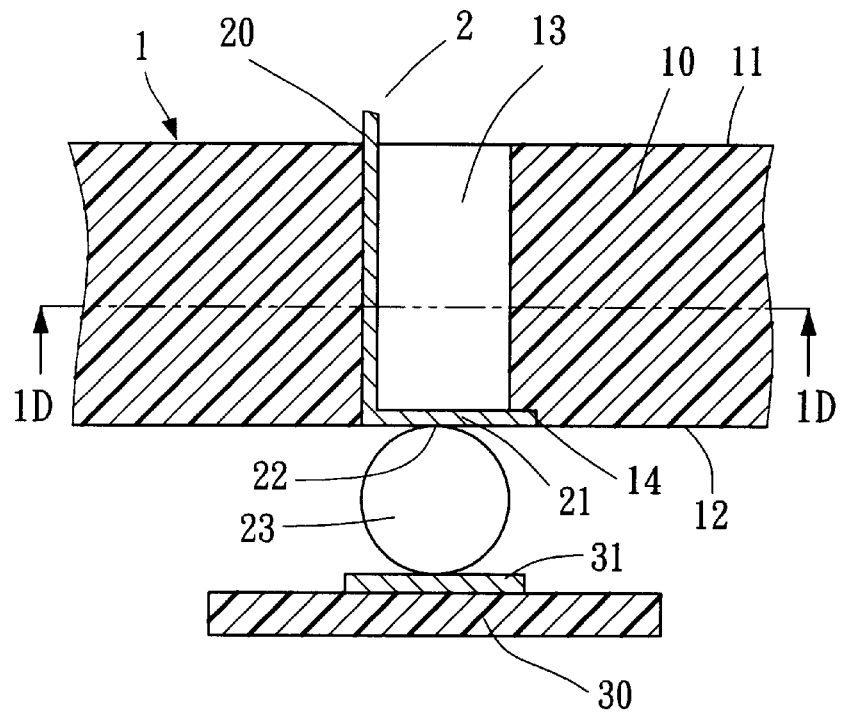
FIG. 1B is a cross-sectional view taken from line 1B—1B of FIG. 1A.
Figure 1C:
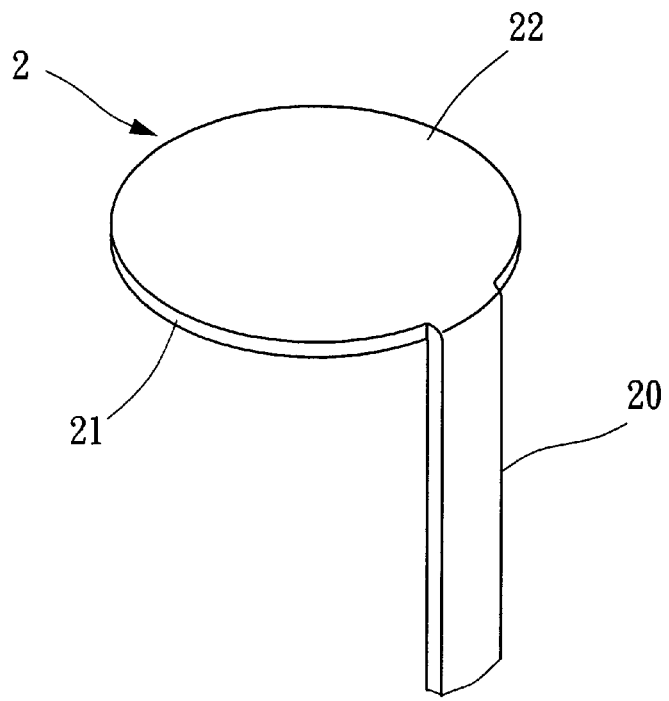
FIG. 1C is a perspective view of a contact of the present invention, wherein a lengthwise portion of the contact is omitted.
Figure 1D:
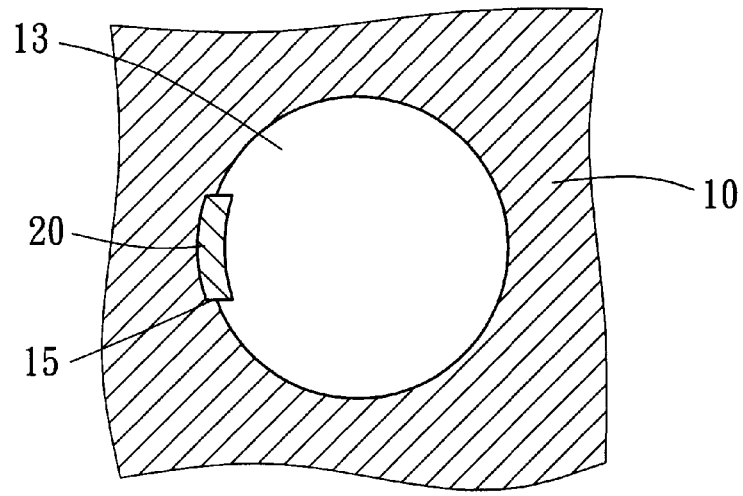
FIG. 1D is a cross-sectional view taken from line 1D—1D of FIG. 1B.

Referring to FIG. 1A, a BGA connector 1 in accordance with the present invention comprises an insulative housing 10 has a mating face 11 and a soldering face 12 and a plurality of contact reception passageways 13 defined from the mating face 11 to the soldering face 12. Also referring to FIGS. 1B, 1C, and 1D, a plurality of contacts 2 are installed in the contact reception passageways 13. Each contact 2 has a vertical contacting portion 20 and a horizontal soldering tail 21 which is substantially a disk-like plate bent from the vertical contacting portion 20 with an angle in the range of 88 to 90 degrees. The bending angle is preferably at 88 degrees so that a preload can exist to force the soldering portion 21 to abut against a step 14 in the lower periphery of the passageway 13 for insuring all the soldering portions 21 are coplanar to each other in the soldering face 12 after the contact 2 is loaded into the passageway 13. The vertical contacting portion 20 is retained in a vertical groove 15 defined in an inner periphery of the passageway 13 with a portion thereof exposing to the passageway 13. The soldering portion 21 of the contact 2 has a bottom 22 facing downward and attached with a solder ball 23. The solder ball 23 may be guaranteed to be soldered on the bottom 22 of the soldering portion 21 rather than on the edge thereof because the bottom 22 has a width larger than the diameter of the solder ball 23. The solder ball 23 is further soldered on a conductor pad 31 of a printed circuit board 30 for mounting the connector 1 on the printed circuit board 30.

Figure 2A:
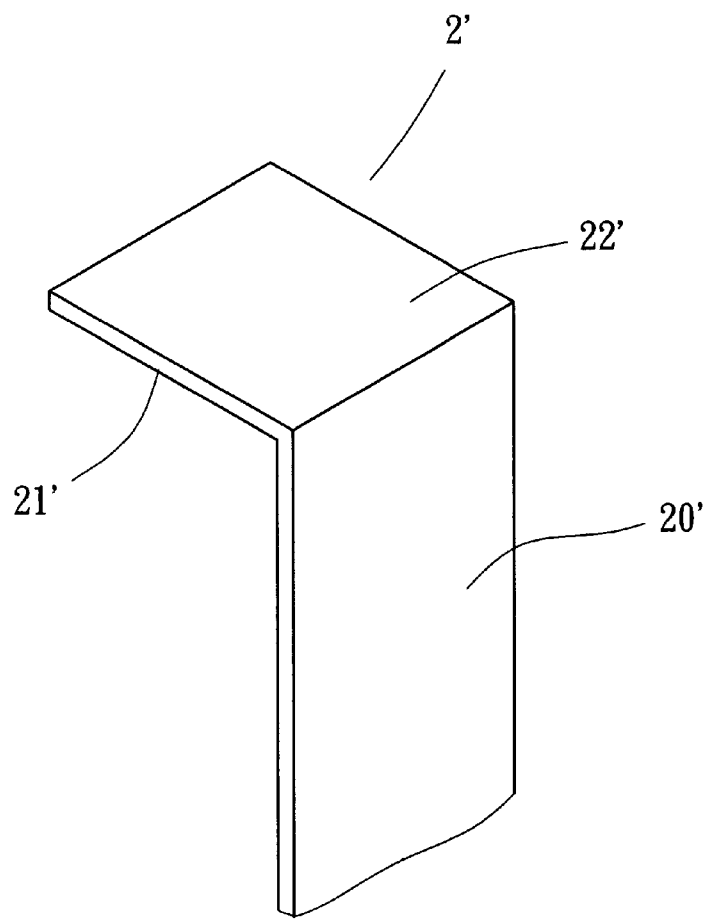
FIG. 2A is a perspective view of a contact in accordance with a second embodiment of the present invention.
Figure 2B:
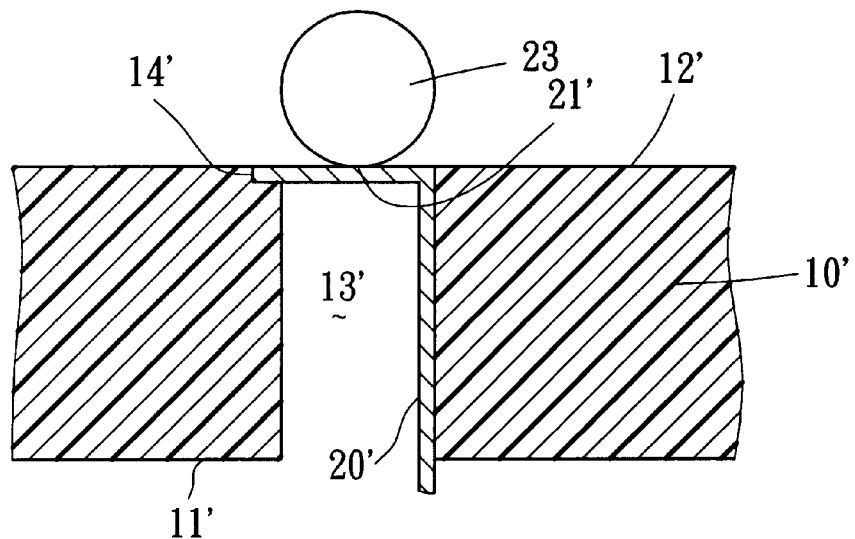
FIG. 2B is a schematic view of a BGA connector using the contact of FIG. 2A.

A second embodiment may be referred to FIGS. 2A and 2B, wherein a plurality of contacts 2' are received in passageways 13' of an insulative housing 10'. Each contact 2' is an L-shaped plate having a vertical contacting portion 20' and a horizontal soldering portion 21' bent from the vertical contacting portion 20' and having a rectangular bottom 22' for attachment of a solder ball 23. The soldering portion 21' are also retained in a step 14' of the passageway 13' and all the soldering portion 21' are coplanar to each other in a soldering face 12' of the housing 10'. Since the rectangular bottom 22' has a relatively large area, the solder ball 23 may be guaranteed to be soldered on the region of the rectangular bottom 22' thereby guaranteeing the coplanarity of all the solder balls 23.

Figure 3:
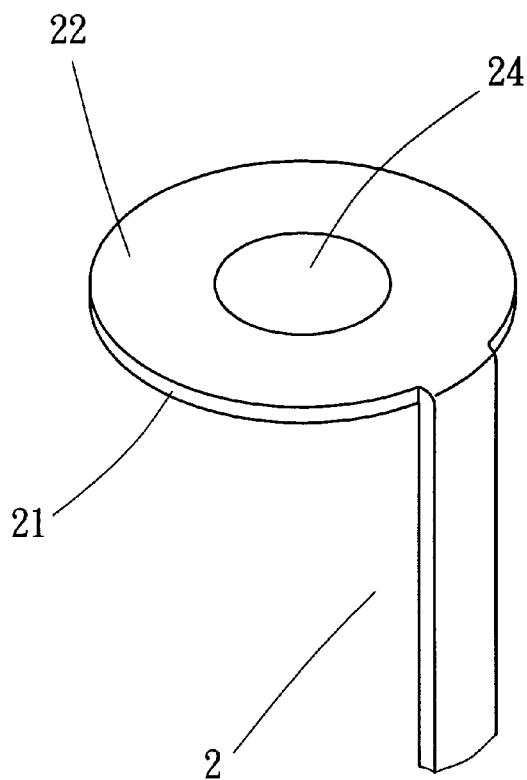
FIG. 3 is a perspective view of a contact in accordance with a third embodiment of the present invention.

A third embodiment as shown in FIG. 3 is improved from the first embodiment, wherein the bottom 22 of the soldering portion 21 of the contact 2 has a recess 24 defined in a center thereof for properly positioning the solder ball 23.

Figure 4:
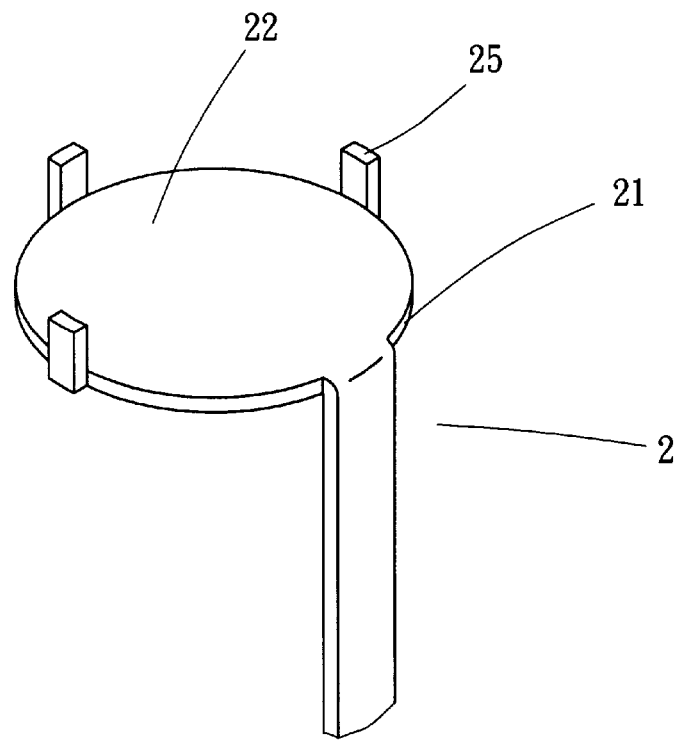
FIG. 4 is a perspective view of a contact in accordance with a fourth embodiment of the present invention.

A fourth embodiment as shown in FIG. 4 is improved from the first embodiment, wherein a plurality of lugs 25 extend downward from a periphery edge of the soldering portion 21 for limiting the solder ball 23 to be soldered on a center of the bottom 22.

Figure 5:
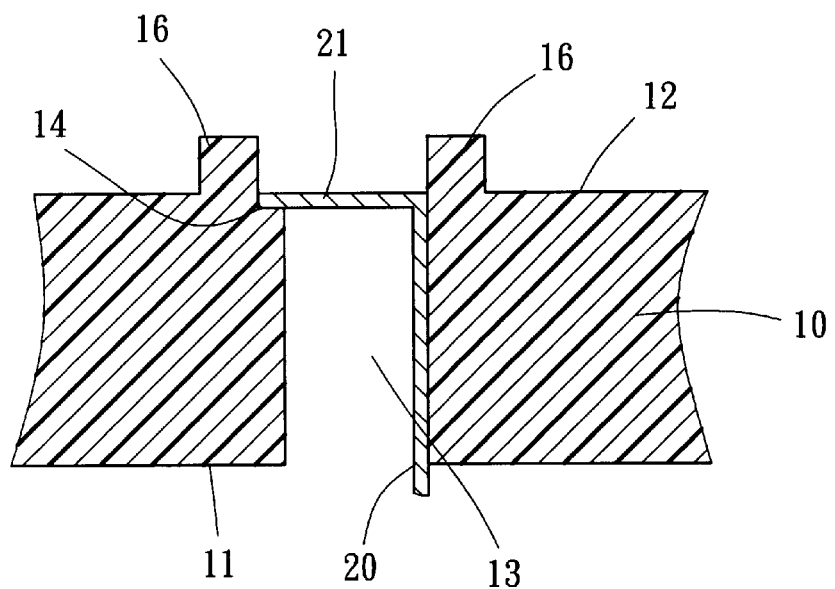
FIG. 5 is a schematic view of a BGA connector in accordance with the present invention.
Figure 6:
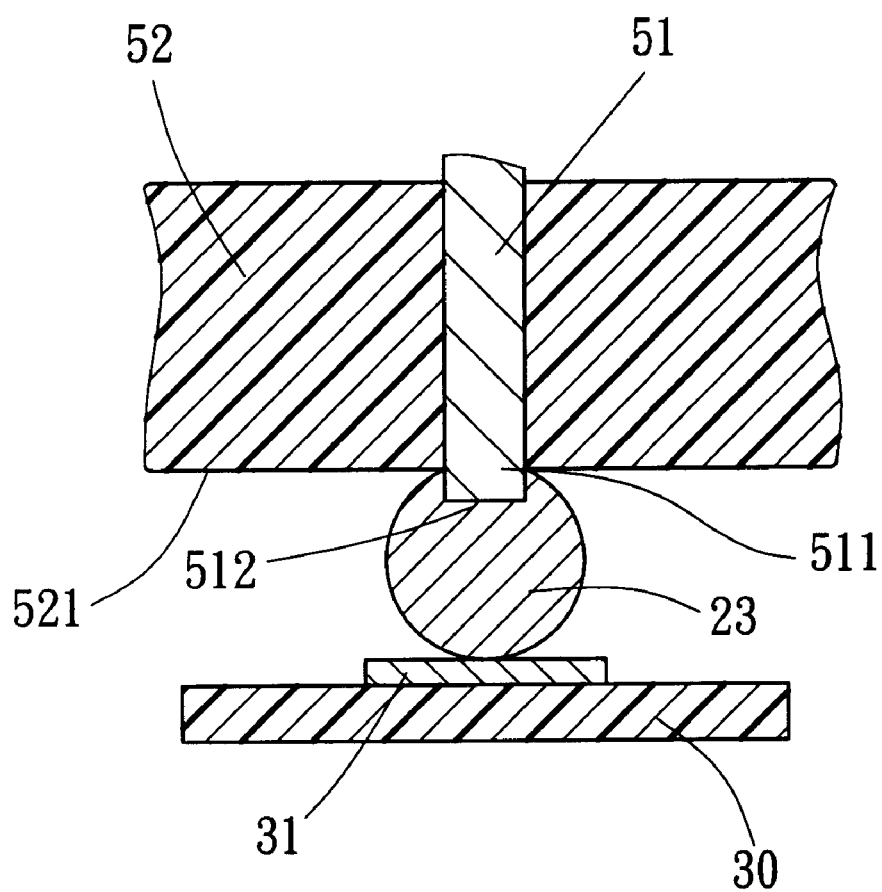
FIG. 6 is a conventional BGA connector.

Referring to FIG. 5, a fifth embodiment is improved from the first embodiment, wherein two standoffs 16 extend from the soldering face 12 of the housing 10 substantially around the passageway 13 for limiting the position of the solder ball 23 on the soldering portion 21.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. A ball grid array connector comprising:
    an insulative housing having a mating face and a soldering face opposite to the mating face and a plurality of passageways defined between the mating face and the soldering face;
    a plurality of contacts received in the passageways and each contact comprising a contacting portion and a soldering portion bent substantially perpendicular to the contacting portion; and
    a solder ball attached to the soldering portion of each contact and the solder ball having a diameter less than a width of the soldering portion of the contact.

2. The ball grid array connector as claimed in claim 1, wherein a step is formed in a lower periphery of the passageway for receiving the soldering portion of the contact.

3. The ball grid array connector as claimed in claim 2, wherein a preload exists between the soldering portion and the contacting portion for forcing the soldering portion to abut against the step in the lower periphery of the passageway for insuring all the soldering portions being coplanar to each other in the soldering face.

4. The ball grid array connector as claimed in claim 2, wherein the soldering portion is a disk-like plate extending from the contacting portion.

5. The ball grid array connector as claimed in claim 2, wherein a recess is defined in a center of the soldering portion of the contact for positioning the solder ball.

6. The ball grid array connector as claimed in claim 2, wherein the soldering portion of the contact is a rectangular plate.

7. The ball grid array connector as claimed in claim 2, wherein a plurality of lugs extending downward from a periphery of the soldering portion of the contact for limiting the solder ball to be soldered on a center of the soldering portion.

8. The ball grid array connector as claimed in claim 2, wherein the housing has two standoffs extending downward from the soldering face thereof substantially around the passageway for limiting the position of the solder ball.

9. A ball grid array connector comprising:
    an insulative housing having a mating face and a soldering face opposite to the mating face and a plurality of passageways defined between the mating face and the soldering face;
    a plurality of contacts received in the passageways and each contact comprising a contacting portion and a soldering portion bent substantially perpendicular to the soldering portion;
    a solder ball attached to the soldering portion of each of said contacts; wherein
    means for restrainedly positioning said solder ball to a center portion of said soldering portion of the corresponding contact.

10. The connector as claimed in claim 9, wherein said means is a recess formed in a center portion of the soldering portion.

11. The connector as claimed in claim 9, wherein said means is a plurality of lugs extending downward from a periphery edge of the solder portion.

12. The connector as claimed in claim 9, wherein said means is a plurality of standoffs extending downward from the soldering face around each of said corresponding passageways.

* * * * *